(12) United States Patent
Okamoto et al.

(10) Patent No.: US 6,282,092 B1
(45) Date of Patent: Aug. 28, 2001

(54) ELECTRONIC CIRCUIT DEVICE AND METHOD OF FABRICATING THE SAME

(75) Inventors: Mikio Okamoto, Hanno; Katsumi Ebara, Wako, both of (JP)

(73) Assignees: Shindengen Electric Manufacturing Co., Ltd.; Honda Giken Kogyo Kabushiki Kaisha, both of Tokyo (JP)

( * ) Notice: Subject to any disclaimer, the term of this patent is extended or adjusted under 35 U.S.C. 154(b) by 0 days.

(21) Appl. No.: 09/322,018

(22) Filed: May 28, 1999

(30) Foreign Application Priority Data

Jun. 12, 1998 (JP) .................................................. 10-164987

(51) Int. Cl.[7] ...................................................... H05K 7/20
(52) U.S. Cl. ...................... 361/704; 165/80.3; 174/16.3; 257/722; 361/710; 361/715
(58) Field of Search .................................. 165/80.2, 80.3, 165/185; 174/16.3; 257/722; 361/690, 704–710, 714–715, 717–722, 752

(56) References Cited

U.S. PATENT DOCUMENTS

| | | | |
|---|---|---|---|
| 4,763,225 | * | 8/1988 | Frenkel et al. ...................... 361/704 |
| 4,899,256 | * | 2/1990 | Sway-Tin ............................... 361/690 |
| 5,155,660 | * | 10/1992 | Yamada et al. ....................... 361/717 |

FOREIGN PATENT DOCUMENTS

| | | | |
|---|---|---|---|
| 2281797 | * | 11/1990 | (JP) ...................................... 361/704 |
| 69577 | | 3/1994 | (JP) . |

* cited by examiner

*Primary Examiner*—Gregory Thompson
(74) *Attorney, Agent, or Firm*—Stevens, Davis, Miller & Mosher, LLP

(57) ABSTRACT

An electronic circuit device having an improved heat dissipating effect, a small size and a high reliability is provided with a metal substrate having a first surface and a second surface and a case. Electronic parts are mounted on only the first surface and the case is united with a radiating fin in one body. The metal substrate is installed in the case such that the metal substrate serves as a cap of the case and the first surface of the metal substrate faces to the case. A resin is provided to fill up a space between the metal substrate and the case, whereby heat generated from the electronic parts is dissipated to the exterior from both the radiating fin and the second surface of the metal substrate.

9 Claims, 3 Drawing Sheets

ELECTRONIC CIRCUIT DEVICE AND METHOD OF FABRICATING THE SAME

BACKGROUND OF THE INVENTION

1. Field of the Invention

The present invention relates to an electronic circuit device for which a high heat radiating or dissipating ability is required and a method of fabricating such an electronic circuit device, and more particularly to the structure of a package of an electronic circuit device and a method for fabrication of the same.

2. Description of Related Art

Prior art will be described referring to FIGS. 4 and 5.

FIG. 4 shows the setting structure of a rectifier for vehicle disclosed by JP-Y-6-9577. A frame member 16 and a substrate 12 are fixed through screws 20 onto a surface of a pedestal or the like (not shown) on which the rectifier is to be installed. Thereby, a structure having an excellent productivity and a satisfactory heat dissipating efficiency is provided. In this structure, no radiating fin is used. There instead, heat dissipation is mainly made from a surface of the rectifier to be installed on the pedestal or the like (or a surface of the substrate 12 having no parts mounted thereon).

On the other hand, the conventional electronic circuit device using a radiating fin is shown in FIG. 5. In the figure, reference numeral 21 denotes a metal substrate, numeral 22 denotes a case, numeral 23 denotes a mold resin, numeral 24 denotes a portion of the case 22 abutting against the substrate 21, numeral 25 denotes a connector, numeral 27 denotes an installation surface of the electronic circuit device, numeral 28 denotes an end face of the case 22, and numeral 29 denotes a radiating fin. In such conventional electronic circuit device with radiating fin, a surface of the metal substrate having no parts mounted thereon is brought into contact with the bottom of the case, thereby improving the heat dissipation from the radiating fin.

However, in the setting structure of the rectifier for this vehicle shown in FIG. 4, heat dissipation is mainly made from the surface of the substrate 12 having no parts mounted thereon, that is, the heat dissipation from a surface of the substrate having parts mounted thereon is not taken into consideration.

In the electronic circuit device shown in FIG. 5, the dissipation of heat thermally conducted from the surface of the metal substrate 21 having no parts mounted thereon and radiated from the radiating fin 29 is satisfactory but the heat dissipation from the installation surface of the electronic circuit device (or a surface of the metal substrate 21 having parts mounted thereon) is not particularly taken into consideration.

SUMMARY OF THE INVENTION

An object of the present invention made in light of the above-mentioned problems is to provide an electronic circuit device which has a heat dissipating ability superior to that of the conventional device.

To attain the above object, an electronic circuit device according to the present invention comprises a metal substrate having a first surface and a second surface, electronic parts mounted on only the first surface of the metal substrate, a case, united with a radiating fin in one body, for housing the metal substrate therein such that the metal substrate serves as a cap of the case and the first surface of the metal substrate faces to the case, and a resin disposed in a space between the metal substrate and the case, whereby heat generated from the electronic parts is dissipated to the exterior from both the radiating fin and the second surface of the metal substrate.

A method of fabricating an electronic circuit device according to the present invention comprises the step of mounting electronic parts on a metal substrate having a first surface and a second surface, the electronic parts being mounted on only the first surface of the metal substrate, the electronic parts including a plurality of electrodes for connecting the electronic circuit device to an external circuit, the step of installing the metal substrate in a case united with a radiating fin in one body such that the metal substrate serves as a cap of the case and the first surface of the metal substrate faces to the case, the case being provided with an opening for drawing out the plurality of electrodes to the exterior, the step of injecting a resin into a space between the metal substrate and the case from the opening of the case, and the step of inserting a member into the opening of the case which protects the plurality of electrodes.

With the construction of the present invention in which the metal substrate is installed in the case such that the metal substrate serves as a cap of the case and the surface of the metal substrate having the parts mounted thereon faces to the case or a surface of the metal substrate having no parts is directed outwards and the space between the metal substrate and the case is filled with the resin, a large amount of heat can be dissipated from both the radiating fin of the case and a surface of the electronic circuit device to be installed on a pedestal or the like, that is, a surface of the metal substrate having no parts, thereby improving the heat dissipation of the metal substrate.

DETAILED DESCRIPTION OF THE EMBODIMENTS

Figure 1:
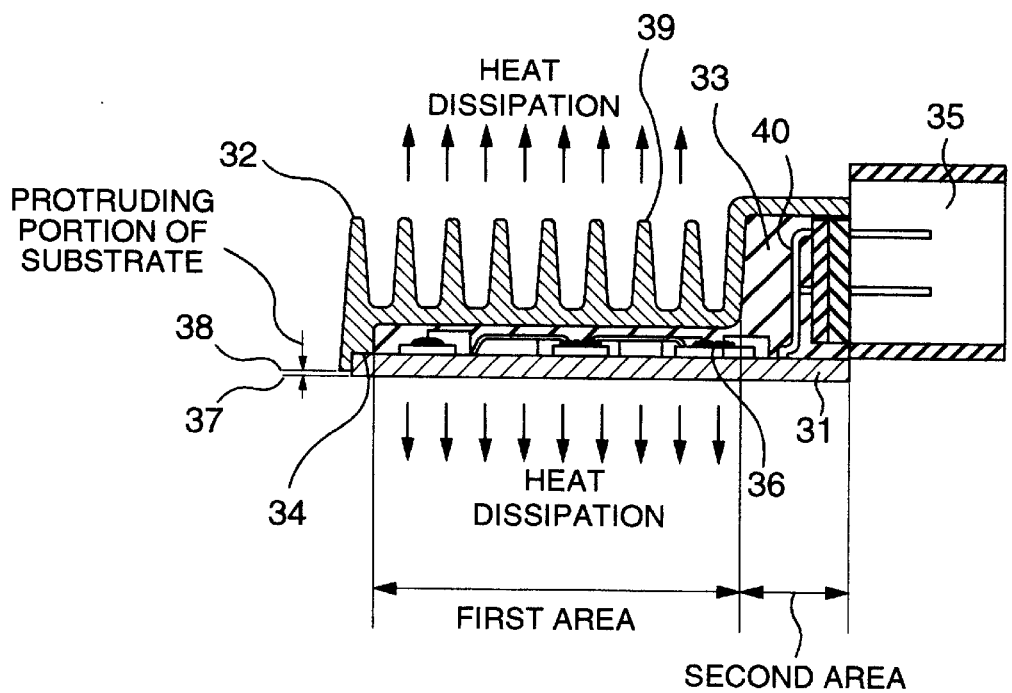
FIG. 1 is a cross section of an electronic circuit device according to an embodiment of the present invention.

FIG. 1 is a cross section of an electronic circuit device according to an embodiment of the present invention. More particularly, the shown electronic circuit device is applied to a rectifier circuit used in a motor vehicle or auto-bicycle. The rectifier circuit receives an AC voltage from a generator and supplies a DC current to a battery through a bridge formed by rectifying diodes. The amount of heat generated from the rectifier circuit is very large. Therefore, heat dissipation with a high efficiency is required.

In FIG. 1, reference numeral 31 denotes a metal substrate, numeral 32 denotes a case, numeral 33 denotes a mold resin, numeral 34 denotes a portion of the case 32 abutting against the substrate 31, numeral 35 denotes a connector, numeral 36 denotes parts mounted on a surface of the substrate 31, numeral 37 denotes a surface of the electronic circuit device to be installed on a pedestal or the like, numeral 38 denotes an end face of the case 32, numeral 39 denotes a radiating fin united with the case 32 in one body, and numeral 40 denotes electrodes.

The metal substrate 31 includes a base made of a metal material such as copper, aluminum or the like and a conductive pattern of copper or the like formed on an insulating film of an epoxy resin or the like formed over the base. The surface mounted parts 36 includes electronic parts such as rectifying diodes, thyristors or the like generating a large amount of heat, chip parts such as transistors, resistors, condensers and so forth forming a control circuit, jumpers, and so forth.

The electrodes 40 are used for electrically connecting the electronic circuit device to an external circuit. The electrode has a height which is at least two times as high as the surface mounted parts 36. The connector 35 protects the electrodes 40 and also serves as a guide for connecting the electrodes 40 to the external circuit.

The bottom of the case 32 includes a shallow portion (a first area) in which the low surface mounted parts 36 are contained and a deep portion (a second area) in which the high electrodes 40 are contained. The shallow portion of the case 32 is formed in proximity to the metal substrate 31 with a first interval kept therebetween so that satisfactory thermal conduction is attained. The deep portion of the case 32 is formed apart from the metal substrate 31 with a second interval kept therebetween. The depth ratio of the deep portion to the shallow portion (that is, the ratio of the second interval to the first interval) is at least 2. A space between the metal substrate 31 and the case 32 is filled with the mold resin 33 for improving the thermal conduction.

A peripheral portion of the case 32 (excepting a portion to which the connector 35 is attached) is provided with a guide for positionally fixing the metal substrate 31, thereby preventing the positional deviation of the metal substrate 31 and providing satisfactory thermal conduction between the metal substrate 31 and the case 32. Also, the metal substrate 31 is fixed to the substrate abutting portion 34 of the case 32 so that a part of the metal substrate 31 protrudes from the case 32, thereby providing satisfactory thermal conduction between the metal substrate 31 and a surface on which the electronic circuit device is to be installed.

Figure 2:
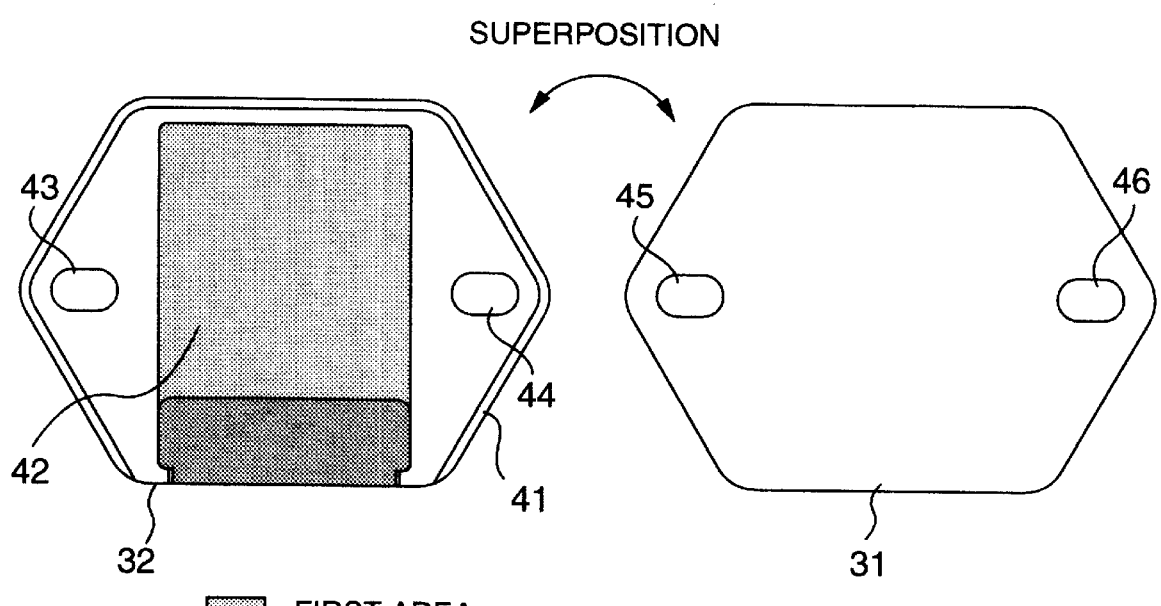
FIG. 2 is a bottom view of each of a case and a metal substrate used in the electronic circuit device according to the embodiment of the present invention.

FIG. 2 shows a bottom view of each of the case 32 and the metal substrate 31 used in the electronic circuit device according to the present embodiment. The bottom 42 of the case 32 is divided into a shallow area (the first area) and a deep area (the second area) which have a difference in level therebetween. As mentioned above, a peripheral portion (a third area) of the case 32 (excepting a portion to which the connector is attached) is provided with a guide 41 for fixing the metal substrate 31. Each of the case 32 and the metal substrate 31 is provided with two mounting holes 43 and 44 or 45 and 46 for fixing the case 32 or the metal substrate 31, and the case 32 and the metal substrate 31 are brought into close contact with each other at a portion of the case bottom 42 surrounding the hole (or a third area). With this structure, not only thermal conduction but also mechanical strength are improved.

Figure 3:
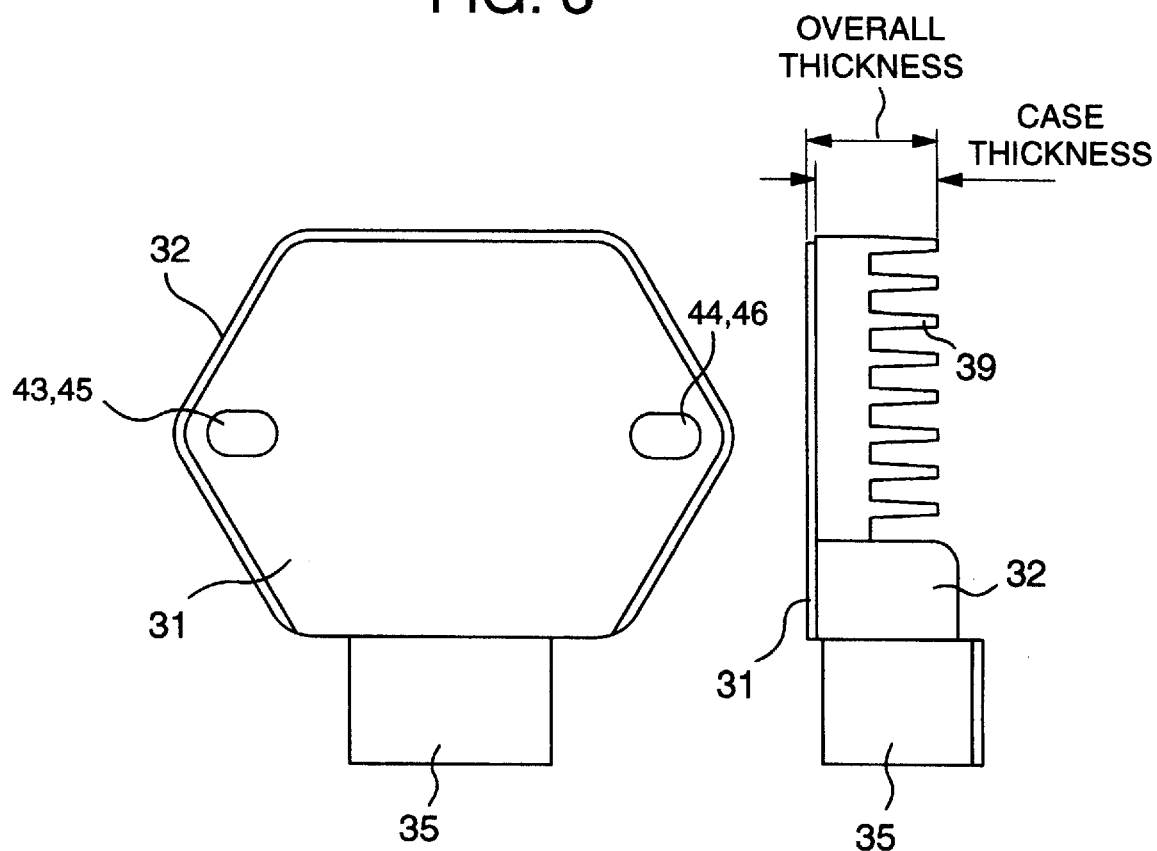
FIG. 3 is a bottom view and a side view of the electronic circuit device according to the embodiment of the present invention.
Figure 5:
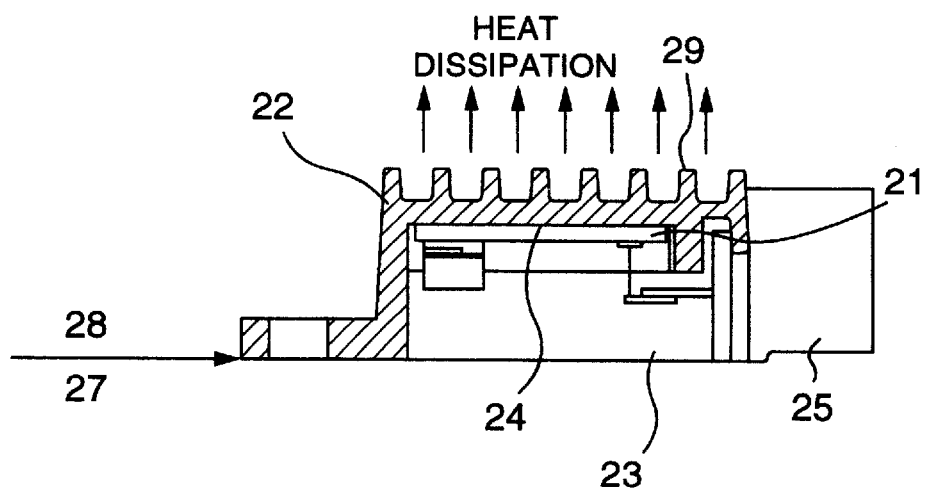
FIG. 5 is a cross section of another conventional electronic circuit device.
Figure 4:
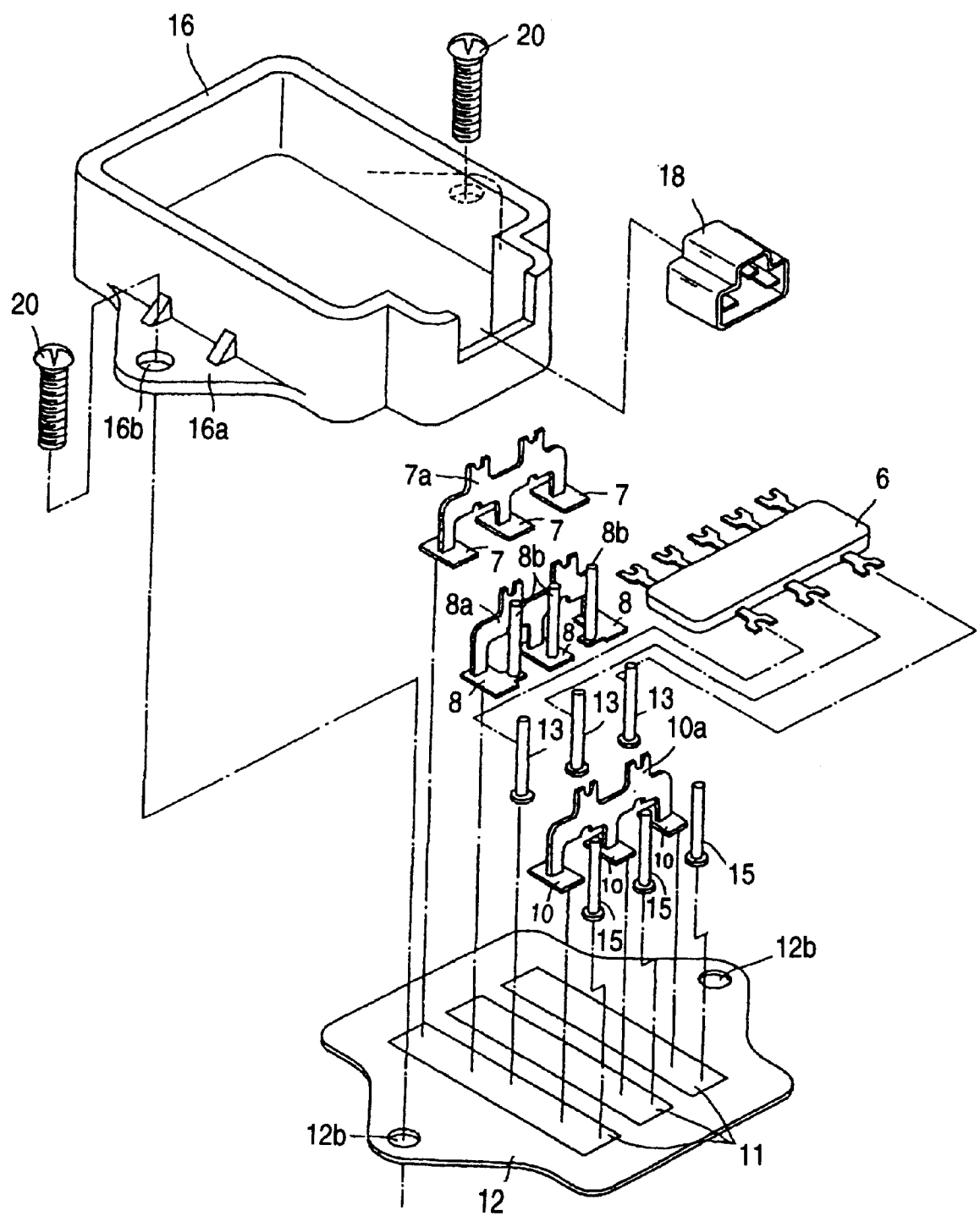
FIG. 4 is an assembly diagram of one conventional electronic circuit device.

FIG. 3 shows a bottom view and a side view of the electronic circuit device of the present embodiment after the completion thereof. As mentioned above, a part of the metal substrate 31 protrudes from the case 32, thereby providing satisfactory thermal conduction between the metal substrate 31 and a surface to which the electronic circuit device is to be attached.

A process for fabrication of the electronic circuit device according to the present embodiment will now be described.

First, electronic parts such as parts 36, electrodes 40 and so forth are jointed onto a conductor pattern of a metal substrate 31 by solder. Next, the metal substrate 31 is fixed to a substrate abutting portion 34 of a case 32 so that a surface of the metal substrate 31 having the electronic parts mounted thereon faces to the case 32. Thereafter, a mold resin 33 is injected into a space between the metal substrate 31 and the case 32 from an opening for attachment of a connector 35. The connector 35 is attached before the mold resin 33 is cured. Since the fixing of the connector 35 is effected by the mold resin 33, the device is completed if the curing of the mold resin 33 is completed.

According to the present invention, since heat dissipation is made from both the radiating fin of the case and the surface of the metal substrate having no parts, it is possible to provide an electronic circuit device which has a heat dissipating efficiency improved as compared with that of the conventional electronic circuit device and has a size reduced as a whole. Further, it is possible to fix the substrate satisfactorily. As a result, thermal conduction between the substrate and the case can be improved. The present invention is remarkably effective when it is particularly applied to an electronic circuit device such as a rectifier circuit device for a motor vehicle or motorcycle, that is, in the case where a surface on which the electronic circuit device is to be installed is made of a metal so that heat dissipation from that surface can be expected. Thereby, it is possible to provide a small-size and high-reliability electronic circuit device. Accordingly, the present invention has a large value in industrial use.

What is claimed is:

1. An electronic circuit device comprising:

a metal substrate having a first surface and a second surface;

electronic parts mounted on only the first surface of said metal substrate;

a case including a radiating fin which is of a one-piece structure therewith, said case having said metal substrate housed therein, wherein said metal substrate serves as a cap of said case, and the first surface of said metal substrate faces an interior region of said case; and a resin disposed in a space between said metal substrate and said interior region of said case, wherein both said radiating fin and the second surface of said metal substrate dissipate heat generated from said electronic parts to an exterior of said case, wherein said case defines a first area at which said case is distanced from said metal substrate with a first interval therebetween providing a least amount of space needed for enclosing said electronic parts, and a second area at which said case is distanced from said metal substrate with a second interval therebetween, said first interval being smaller than said second interval.

2. An electronic circuit device according to claim 1, wherein said case further defines a third area at which said case is brought into close contact with said metal substrate.

3. An electronic circuit device according to claim 2, wherein said first interval is not larger than one half of said second interval.

4. An electronic circuit device according to claim 3, wherein said metal substrate has a conductive pattern formed on an insulating film formed over a metal plate, and said electronic parts includes flat package parts mounted on said conductive pattern and in the first area of said case and a plurality of electrodes, mounted on said conductive pattern and in the second area of said case, for electrically connecting said electronic circuit device to an external circuit.

5. An electronic circuit device according to claim 2, wherein said case and said metal substrate have mounting holes for use of fixing said case and said metal substrate to each other, said holes being provided in the third area of said case.

6. An electronic circuit device according to claim 1, wherein said second surface of said metal substrate protrudes from said case.

7. An electronic circuit device according to claim 1, wherein said case has a guide for positionally fixing said metal substrate to prevent the positional deviation of said metal substrate, said guide bringing said case into close contact with said metal substrate along an outer periphery of said metal substrate.

8. A method of fabricating an electronic circuit device, the method comprising the steps of:

mounting electronic parts on a metal substrate having a first surface and a second surface, said electronic parts being mounted on only the first surface of said metal substrate, said electronic parts including a plurality of electrodes for connecting said electronic circuit device to an external circuit;

installing said metal substrate in a case including a radiating fin which is of a one-piece structure therewith, wherein said metal substrate serves as a cap of said case and the first surface of said metal substrate faces an interior region of said case, said case being provided with an opening for drawing out said plurality of electrodes to an exterior;

injecting laterally a resin into said interior region between said metal substrate and said case from said opening of said case; and inserting a member into said opening of said case to protect said plurality of electrodes.

9. An electronic circuit device according to claim 1, wherein said radiating fin is located at said first area of said case.

* * * * *